United States Patent
Jacobson et al.

(10) Patent No.: US 7,416,630 B2
(45) Date of Patent: Aug. 26, 2008

(54) FABRICATION OF LTCC T/R MODULES WITH MULTIPLE CAVITIES AND AN INTEGRATED CERAMIC RING FRAME

(75) Inventors: Rena Y. Jacobson, Ellicott City, MD (US); Tapan K. Gupta, Ellicott City, MD (US); John S. Fisher, III, Ellicott City, MD (US); Andrea Curbean, Baltimore, MD (US)

(73) Assignee: Northrop Grumman Corporation, Los Angeles, CA (US)

( * ) Notice: Subject to any disclaimer, the term of this patent is extended or adjusted under 35 U.S.C. 154(b) by 546 days.

(21) Appl. No.: 10/718,805

(22) Filed: Nov. 24, 2003

(65) Prior Publication Data

US 2005/0109453 A1 May 26, 2005

(51) Int. Cl.
    *B32B 31/00* (2006.01)
(52) U.S. Cl. .................. 156/253; 29/25.42; 438/123
(58) Field of Classification Search ............... 29/25.42; 343/700 MS; 156/89.12, 253; 438/123; 257/680
    See application file for complete search history.

(56) References Cited

U.S. PATENT DOCUMENTS

| | | | |
|---|---|---|---|
| 5,157,364 A | 10/1992 | Pond et al. | |
| 5,661,882 A * | 9/1997 | Alexander | 29/25.42 |
| 5,859,614 A | 1/1999 | Paolella et al. | |
| 6,099,677 A * | 8/2000 | Logothetis et al. | 156/253 |
| 6,114,986 A | 9/2000 | Cassen et al. | |
| 6,384,473 B1 * | 5/2002 | Peterson et al. | 257/680 |
| 6,387,507 B1 | 5/2002 | Jones, II et al. | |
| 6,492,949 B1 * | 12/2002 | Breglia et al. | 343/700 MS |
| 6,531,341 B1 * | 3/2003 | Peterson et al. | 438/123 |
| 6,592,696 B1 * | 7/2003 | Burdon et al. | 156/89.12 |
| 2003/0011519 A1 | 1/2003 | Breglia et al. | |
| 2003/0151863 A1 | 8/2003 | Ralph | |

FOREIGN PATENT DOCUMENTS

KR  2002 087 144 A  11/2002

* cited by examiner

*Primary Examiner*—Joseph Valenza
(74) *Attorney, Agent, or Firm*—Andrews Kurth LLP

(57) ABSTRACT

A method of fabricating a transmit/receive (T/R) module utilizing low temperature co-fired ceramic (LTCC) material in place of high temperature co-fired ceramic (HTCC) material and utilizing a combination of multiple lamination steps which also include forming a ceramic frame, as opposed to a metal ring frame, in the process. Brazing metallization is also utilized to attach heat sinks and lids as well as pin connectors. The formation of the pin connectors is provided on the side surface of the T/R module with a side printing process.

19 Claims, 2 Drawing Sheets

FABRICATION OF LTCC T/R MODULES WITH MULTIPLE CAVITIES AND AN INTEGRATED CERAMIC RING FRAME

BACKGROUND OF THE INVENTION

1. Field of the Invention

This invention relates generally to microwave transmit/receive (T/R) modules used in connection with an active aperture of a phased array radar system and more particularly to the method of fabricating T/R module packages utilizing laminated layers of low temperature co-fired ceramic (LTCC) material.

2. Description of Related Art

Phased array radars utilizing electronically scanned antenna arrays, also referred to as active apertures, require many individually controllable T/R modules which are arranged in an array. The T/R modules are connected to frontally located radiator elements which collectively generate a transmitted radar beam. The beam is normally energized, shaped and directed in azimuth and elevation under electronic control of the signals applied to the individual radiators.

Present state of the art T/R module packages include a structure in the form of a multi-cavity, multi-layer substrate comprised of high temperature co-fired ceramic (HTCC) layers including, for example, black alumina ceramics and tungsten. The ceramic layers have outer surfaces including metallization patterns of ground planes and conductors as well as feedthroughs or vertical vias formed therein for providing three dimensional routing of both RF and DC signals. Active circuit components comprised of integrated circuit chips are located in the various cavities of the substrate which implement suitable control and generating functions of RF signals to and from respective antenna elements. One such T/R module is shown and described in U.S. Pat. No. 6,114,986 entitled "Dual Channel Microwave Transmit/Receive Module for an Active Aperture of a Radar System", issued to John W. Cassen et al. on Sep. 5, 2000, the details of which are incorporated herein by reference.

In the Cassen et al. patent, two discrete transmit/receive (T/R) channels are implemented in a single common T/R module package having the capability of providing combined functions, control and power conditioning while utilizing a single multi-cavity, multi-layer substrate comprised of high temperature co-fired ceramic (HTCC) layers.

Although packages for active and passive electronic components fabricated from multiple layers of low temperature co-fired ceramic (LTCC) tape are known in the prior art, the conventional method of fabricating these LTCC packages has been found to be adequate only for fabricating multi-layer substrates with a small number, typically 5-10 layers of tape. This method, however, has been found to be completely inadequate for fabricating highly complex packages of 20 or more layers of tape and having multiple cavities with different floor thicknesses, through-holes, and an integrated ring frame in the package as required, for example, by an LTCC T/R module utilized in a radar system.

SUMMARY

Accordingly, it is an object of the present invention to provide an improvement in the method of fabricating transmit/receive (T/R) module packages and substrates used in connection with an active aperture of a pulsed radar system.

It is another object of the present invention to provide an improved method of fabricating the substrates of T/R module packages with a type of ceramic material which reduces weight and electrical loss while at the same time increasing performance.

It is a further object of the invention to provide an improved method of fabricating the substrates of T/R module packages with low temperature co-fired ceramic (LTCC) material.

These and other objects are achieved in the present invention by an improved method of fabricating T/R modules with low temperature co-fired ceramic (LTCC) material which permits relatively easy construction of multiple cavities in a substrate having different floor thicknesses for the placement of active and passive circuit components (e.g. semiconductor chips) as well as through-holes in a relatively thick package, on the order of 200-250 mils, containing 20 or more individual layers of 5 mil thick (LTCC) tape, as opposed to the known prior art LTCC packages, and including an integrated ceramic ring frame that is also formed within the package. Brazing metallization is also used to attach heat sinks and covers or lids. Furthermore, a side printing capability of brazeable metallization is provided so as to attach connector pins thereto. The result is an LTCC package for a T/R module which is relatively simple, elegant and light weight.

In the subject method of fabrication of the substrate, a number of LTCC tape layers are initially divided into multiple stacks of tape layers, e.g., four stacks or sections, based on a final cavity routing configuration of each stack. One of the stacks comprises a set of layers for the formation of a ceramic ring frame. Each stack is then separately tack laminated, followed by cavity patterns being machined therein using a router device whereby a large number of layers are routed in a single pass, forming cavities having side walls which are relatively smooth and straight as opposed to the known prior art method of cutting individual layers with a laser, for example, which results in the formation of jagged side walls. Following cavity routing, all of the stacks are laid up on a base plate including a set of tooling pins for providing alignment of the stacks. The lay up is completed with a placement of a top Mylar template followed by a copper template. The assembly is next covered with an expandable latex sheet that has been lightly coated with a graphite aerosol for aiding the removal of the latex sheet without metal lift-off after lamination. The assembly is then placed in a lamination fixture and isostatically laminated for a specific period of time at a predetermined pressure and temperature, typically 4000-5000 psi at 72° C. for 15 minutes, resulting in a structure in the form of laminated panel. The panel is then allowed to cool, removed from the fixture where it is green cut to remove tooling holes and then fired with a designated firing profile. A plurality of mutually identical LTCC substrates for a T/R module are then diced, i.e. cut, from the panel and post fire printed as required.

Further scope of applicability of the present invention will become apparent from the detailed description provided hereinafter. It should be noted, however, that the detailed description and specific example, while indicating the preferred method of the invention, is provided by way of illustration only, since various changes, alterations and modifications coming within the spirit and scope of the invention will become apparent to those skilled in the art from the following detailed description.

BRIEF DESCRIPTION OF THE DRAWINGS

The present invention will become more fully understood when considered in conjunction with the accompanying drawings, which are provided by way of illustration and thus are not meant to be considered in a limiting sense, and wherein.

DETAILED DESCRIPTION OF THE INVENTION

The subject invention is directed to three new features of LTCC T/R module packages resulting from advances in materials and process technologies not heretofore available, namely: (1) an improved process that permits fabrication of multiple cavities and through holes in a very thick package; (2) a ceramic ring that is integrally formed within the package; and (3) attachment of heat sinks and lids with brazing metallization and a side printing capability for attaching connector pins.

Figure 1:
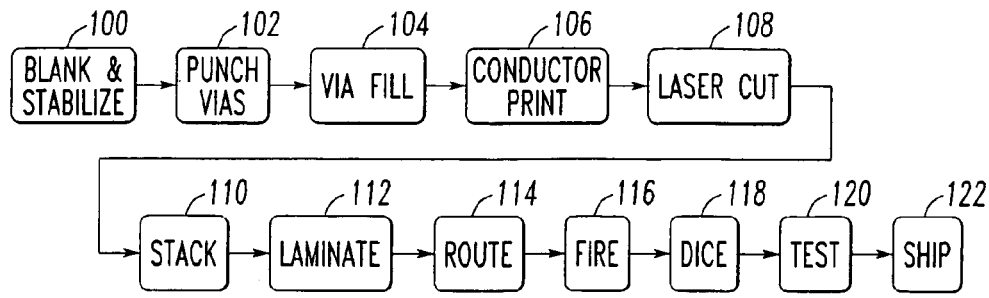
FIG. 1 is a flow diagram illustrative of a known prior art fabrication process conventionally used in the fabrication of LTCC packages comprised of a relatively small number of LTCC tape layers.

The known prior art process for fabricating LTCC packages is shown in FIG. 1. The method of FIG. 1 consists of blanking and stabilizing the green tape, punching vias, filling the via holes, and screen printing the conductor layers as shown by steps 100, 102, 104 and 106. For cavities in the substrate, each of the desired layers are then subjected to laser cutting, one at a time, as shown by step 108, which is followed by collating and stacking as shown in step 110, form cavities in the completed part, which may be, for example, a substrate for electronic components such as integrated circuit chips. The stacked part is then isostatically laminated, routed to remove the tooling holes, fired and diced, as shown by steps 112, 114, 116 and 118. Following this, the part is tested and shipped as shown by reference numerals 120 and 122.

The process flow illustrated in FIG. 1 is found to be adequate for building multi-layer substrates with, for example, 10-15 layers of tape. However, it was found that such a process could not be employed in the fabricating of T/R modules consisting of 20 or more layers of LTCC tape having multiple cavities with different floor thickness, through-holes and an integrated ceramic ring frame as opposed to a heretofore used metal ring frame. To form all these cavities in the tape requires the removal of a substantial amount of material from the green tape and the conventional time consuming laser cutting of individual tape layers makes manufacturing parts highly uneconomical. The solution to this problem lies in forming the cavities in a laminated stacked section of multiple layers of LTCC tape rather than in individual tape layers. This is particularly important for the formation of a ceramic ring frame, as opposed to a conventional metal ring frame, that must be simultaneously co-fired with the package and which constitutes the subject matter of the subject invention. Such a process is shown in FIG. 2, which discloses an inventive change in sequence and number of process steps.

Substrate Fabrication

Figure 2:
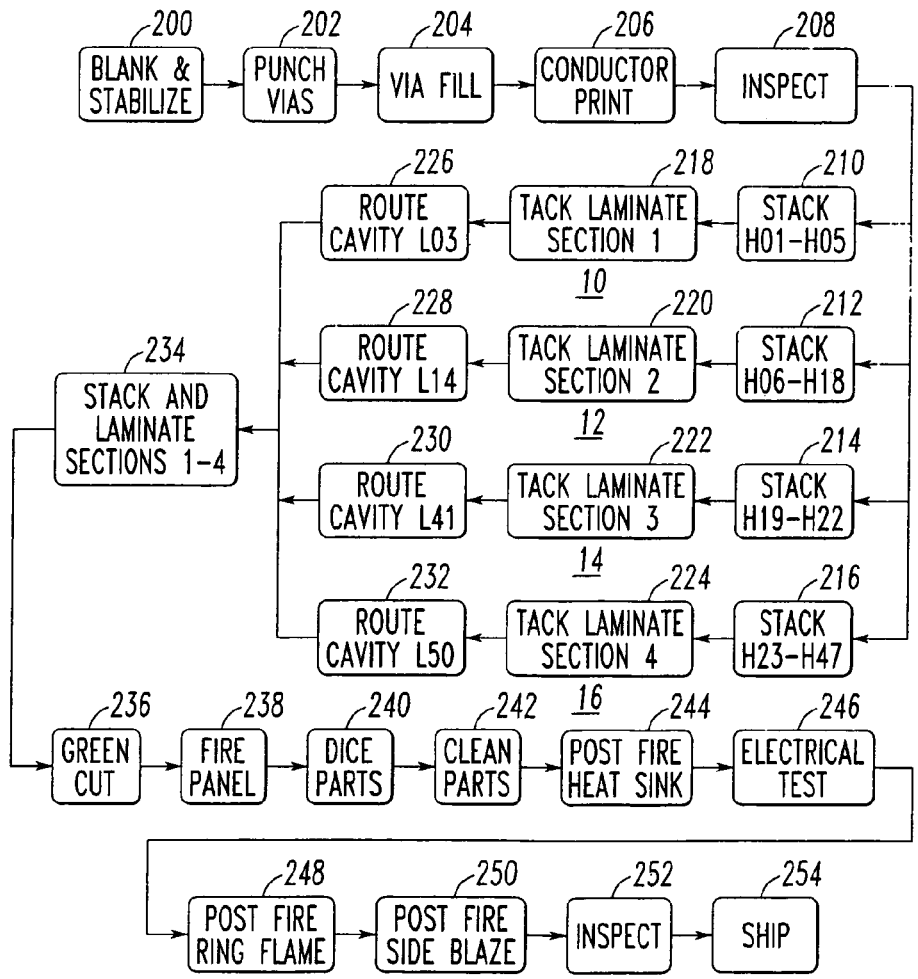
FIG. 2 is a flow diagram illustrative of the process of fabricating an LTCC package for T/R modules in accordance with the subject invention comprised of a relatively large number of LTCC tape layers.
Figure 3:
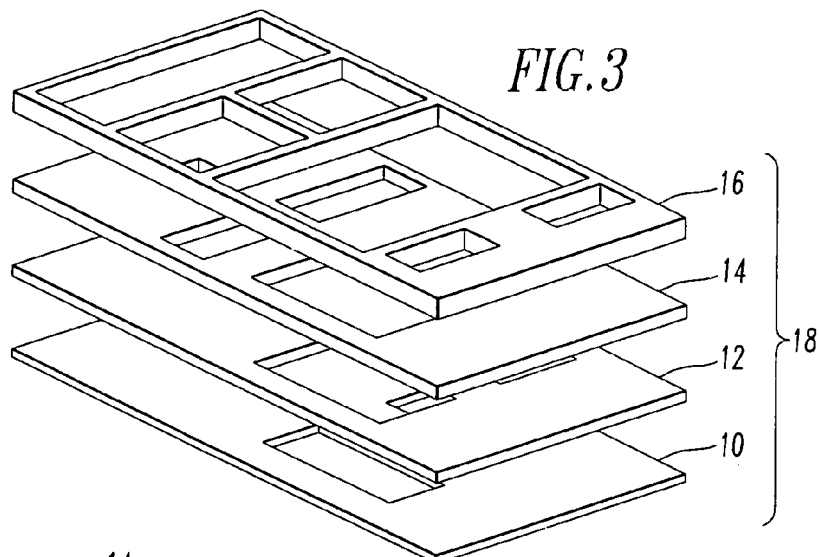
FIG. 3 is an exploded isometric view of four LTCC multi-layer laminated tapes in accordance with the method shown in FIG. 2.

Referring now to FIG. 2 which discloses the preferred method of the subject invention, the process steps up to conductor printing and including of blanking the green tape, punching the vias, filling the via holes and screen printing, as shown in steps 200-206, are the same as shown in the prior art process of FIG. 1. Now, however, following an inspection step as shown by reference number 208, a plurality of, for example, forty seven tape layers (H01-H47) for the simultaneous fabrication of plurality of identical T/R module substrates, one of which is shown, for example, in FIGS. 4 and 5 by reference numeral 20, are divided and stacked into four sections 10, 12, 14, 16 as shown by steps 210, 212, 214 and 216. Section 10 is comprised of a stack of five layers H01-H05, the second section 12 is comprised of a stack of twelve layers H06-H18, the third section 14 is comprised of a stack of four layers H19-H22, and the fourth section 16 is comprised of a relatively thick stack of twenty four tape layers, H23-H47, the latter section comprising a stack of tape layers which is used for the formation of a ceramic ring frame. The four tape sections 10, 12, 14 and 16 are separately tack laminated at a pressure of 1000-2000 psi as shown by steps 218, 220, 222 and 224. Specific cavity patterns are next machined in the four individual laminated tape sections 10-16, as shown in FIG. 3 by reference numeral 18 by routing using a DNC (direct numerical control) router as shown by steps 226, 228, 230 and 232.

There are two advantages associated with using routing, namely: first, unlike a laser process, a large number of layers can be routed in one pass requiring very little time, and secondly, cavity walls formed by routing are smooth and straight in contrast to a jagged wall formed by individual layers being cut by a laser. A smooth and straight side wall is essential for ease of subsequent semiconductor chip placement.

Figure 4:
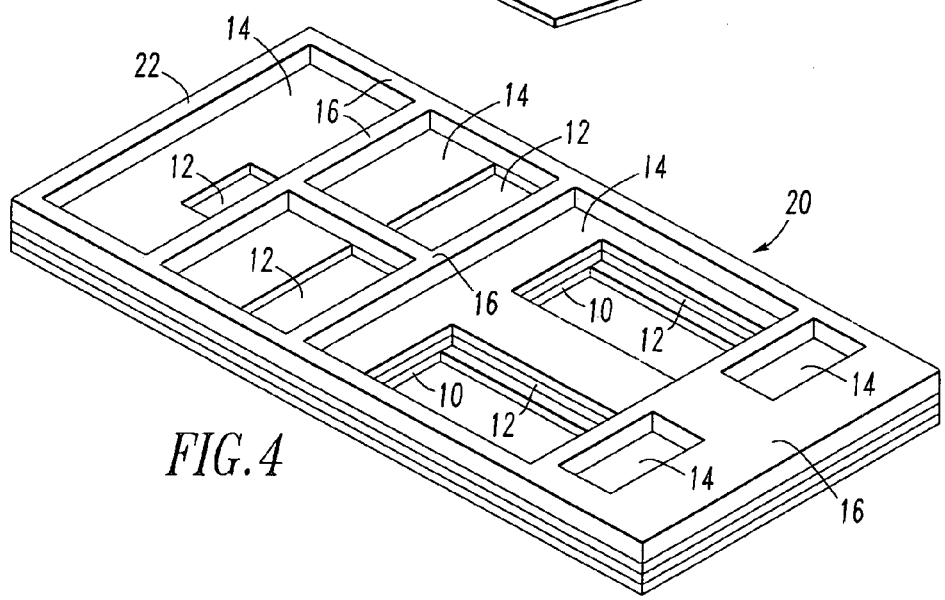
FIGS. 4 and 5 are isometric and top planar views of a composite laminated assembly of the four LTCC tape sections shown in FIG. 3.
Figure 5:
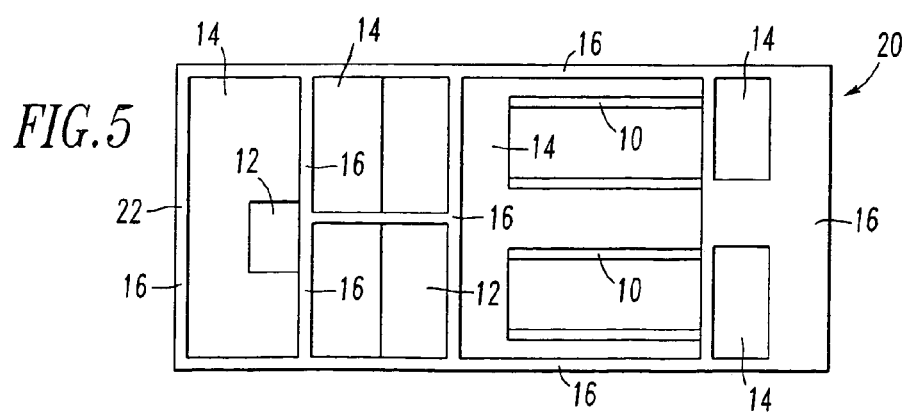

After cavity routing and cleaning of the four laminated tape sections 10, 12, 14 and 16 as shown by steps 226, 228, 230 and 232 of FIG. 2, the four sections are stacked on a copper base plate, not shown, which includes tooling pins per step 234 for providing an alignment mechanism. The four section stack of LTCC tape is next covered with a green expandable "Stretchlon SL 200" (TM) latex sheet, not shown, that has been lightly coated with a graphite aerosol to facilitate the removal of the latex sheet without metal lifting off after lamination. The assembly is then placed in a well known lamination fixture and isostatically laminated at 4000-5000 psi, at 72° C. for 15 minutes. This lamination step results in a composite multi-layer panel 20 of a plurality of individual substrate parts, one of which is shown in FIGS. 4 and 5. The panel is then taken out of the fixture after it is allowed to cool, where it is green cut as shown in step 236 to remove tooling holes and fired with a designated firing profile as shown by step 238. Parts comprising a substrate of a T/R module package are then diced, cleaned and post fire printed, as required in a conventional manner as shown by steps 240, 242 and 244 to provide individual substrates 20.

Ceramic Ring Fabrication

The ring frames of T/R modules, one example of which is shown in U.S. Pat. No. 6,114,986, are conventionally made out of metal, typically Kovar, that are solder-or braze-attached to ceramic substrates which are then hermetically sealed with metal lids using a seam or laser welding technique. The T/R module, when built with HTCC technology, lends itself to nickel and gold plating as a post-fire operation for attachment of the metal ring frame.

However, since plating is not allowed in connection with LTCC tape material, and due to the special design of the connector bulkhead that prevents post printing of metal, the Kovar ring frame is not an option for LTCC T/R modules. This difficulty has now led to the inclusion of a ceramic ring frame 16, shown in FIGS. 3-5, that is produced from the same tape material as the package, and is simultaneously co-fired with the package including the sections 10, 12 and 14 so that the cost of having and attaching a separate ring frame to a ceramic package is completely eliminated. The cost of developing a fixture and the firing profile for soldering or brazing is also eliminated. Having a ceramic ring frame attached to a ceramic package, the CTE mismatch problem between ceramic and metal, unavoidable in HTCC, is skillfully avoided in LTCC, and the weight of the ring frame is reduced by ~62%.

Finally, the cost is further reduced by the fact that the ceramic ring frame 16 is formed from the LTCC tape layers H23-H47 shown in FIG. 2 that would otherwise be thrown away to make room for cavities for placing the metal ring frame adjacent to the ceramic bulkhead. To be able to use this throw-away tape to build the ceramic ring frame is a formidable way to reduce cost. The integrated ring frame 16 in the T/R module package of the subject invention is 50 mils wide on the outside and has 6 internal walls that are 45 mils wide. The walls are marked by staggered vias and internal ground planes to provide adequate electrical isolation of the parts, and can receive co-fired or post-fired metal layers on the top for lid attachment, a significant improvement in the art.

The fabrication of the ceramic ring frame 16 starts with the building of sections 10, 12, 14 and 16, described in FIG. 2 with reference to steps 210-216. Section 16 comprises the ring frame section and is formed in step 216 and consists of 25 layers of tape (H23-H47) which are via filled and printed within the confines of the ring frame width. This section is machined e.g. routed in step 232 using a program that produces the desired ring frame configuration required. The ring frame section 16 is then placed on top of the Sections 10, 12 and 14 of the package in step 234 of FIG. 2, using the tooling holes for alignment and is laminated as described before. During final lamination in step 234, pressure is applied in such a way that all sections are well pressed into one part without delamination, shape distortion, collapse or buckling of the ring frame section. This is one of the most important steps for maintaining the shape of the ring frame structure in the green and fired states. After lamination, the tooling holes are routed off, and the parts are fired in panel form using the designated firing profile. After firing, the individual modules 20 are diced from the panel to the final dimension as noted earlier per step 240 and post fired printed as required as shown by reference numeral 248 and then electrically tested as shown by step 246.

Brazing

A T/R module fabricated with LTCC material in accordance with this invention requires that a heat sink, a lid, and the pin connectors, be attached to the surfaces of the LTCC substrate. Brazing has been found to be desirable for use in making these attachments. With respect to the selection of the most desirable metallization for attachment and its method of application, experimentation resulted in the selection of metallization manufactured by the DuPont Corporation as thick film brazing system materials 5062 and 5063, since the HTCC substrate material is fabricated with a DuPont ceramic composition. Experiments were carried out to determine the best thickness of each material to be applied. The 5062 metallization material is used in the fabrication of glass rich adhesion layer(s). The 5063 metallization is used in the fabrication of gold bonding layer(s). Different screens and printing parameters were used to determine the quickest method to get a print that was approximately 1 to 1.5 mils thick. Screens of different mesh counts and different wire diameters were used in the experiments. 290 mesh, 0.8 mil wire diameter screens were used in the first experiment. Several test pieces were side printed with the 5062 metallization. This first print gave an average fired print thickness of 0.18 mils. A second print of 5063 metallization gave an average fired print thickness of 0.43 mils. The third print was made with 5063 material. This print had an average fired thickness of 0.66 mils. A fourth and final print was made using the 5063 material. This print had an average fired thickness of 0.86 mils. The next screen used for this experiment was a 230 mesh. 1.6 mil wire diameter screen. The first print of 5062 had an average print thickness of 0.50 mils. The second print was made with 5063 and had an average thickness of 0.84 mils. The last print of 5063 had an average print thickness of 1.20 mils. The 230 mesh screens provide a thicker print and therefore reduce the number of prints and firings required to complete the part.

Side Printing

To build a T/R module in LTCC in accordance with the subject invention, a method of printing brazeable metallization on the side wall, for example, on the front wall 16 of the module 20 as shown in FIGS. 4 and 5 has been developed and is utilized since LTCC does not accept the standard HTCC approach of nickel/gold plating. There was no way to use a standard screen printer due to the height limitations as well as the hold down mechanism. This is overcome by modifying a conventional screen printer to accommodate and hold the part securely as it is being printed.

Side printing of the new T/R module design is made possible by adding a print fixture onto a modified MPM SP-1500 Semi-Automatic Screen Printer which includes free space at the back of the printer nest plate. The normal clearance of screen printers including the SP-1500 is "1". This fixture made it possible to print on the side of a 2" long T/R module substrate 20.

The module sits flush with the print surface while being held in the fixture which extends below the nest plate. This allows the printer head to clear the substrate surface.

In testing the modified fixture, it was determined that the travel speed of the nest plate caused the fixture to break the limit switch at the back of the machine. The printer was therefore further modified to reduce the nest plate travel speed. Once the speed was reduced, the fixture was found to hold the substrate in a proper position and printing of the substrate side wall could be printed for the attachment of pin connectors, not shown, to the front wall 22 as shown by step 250 which includes post firing. Inspection and shipping, as shown by steps 252 and 254, complete the process.

Thus what has been shown and described is a method of fabrication of transmit-receive (T/R) modules with LTCC material including a new combination of process steps.

The detailed description provided above, however, merely illustrates the principles of the invention. It will thus be appreciated that those skilled in the art will be able to devise various changes and modifications which, while not explicitly described or shown herein, embody the principles of the invention embodied in the accompanying claims and are thus within its spirit and scope.

The invention claimed is:

1. A method of fabricating a package for an electronic device with low temperature co-fired ceramic (LTCC) including one or more multi-layer parts having multiple cavities therein for the location of active and passive electronic circuit components, comprising the steps of:

dividing and stacking a plurality of partially fabricated layers of LTCC material into a predetermined number of stacks, each of the stacks including a predetermined number of LTCC layers based on a respective cavity configuration to be subsequently formed therein;

separately laminating each of the stacks of LTCC layers at a first predetermined pressure into individual sections of laminated LTCC material;

forming desired cavity patterns into each of said sections;

stacking the sections including the cavity patterns formed therein into an assembly of contiguous sections;

placing the assembly in a lamination fixture; and isostatically laminating the assembly of the sections at a second predetermined pressure into a composite LTCC structure;

wherein said layers of LTCC tape comprise at least 20 layers of about 5 mil thick tape.

2. A method according to claim 1 wherein said composite structure comprises a panel of a plurality of like LTCC parts.

3. A method according to claim 2 and additionally including the step of separating the panel into individual parts.

4. A method according to claim 3 wherein said individual parts comprise substrates for a circuit module utilized in an electronic system.

5. A method according to claim 1 wherein said predetermined number of stacks of LTCC material include one stack for the fabrication of a ceramic ring frame and the remaining stacks are utilized for forming a substrate for a transmit/receive (T/R) module in a radar system.

6. A method according to claim 1 wherein said LTTC structure comprises at least one substrate for a transmit/receive (T/R) module for an active aperture of a phased array radar system.

7. A method according to claim 6 wherein one of said sections comprises an outer ceramic ring for the substrate.

8. A method according to claim 7 wherein said layers of LTCC materials comprise layers of LTCC tape.

9. A method according to claim 8 wherein said step of separately laminating each of the stacks comprises laminating the stacks of LTCC tape.

10. A method according to claim 9 wherein said first predetermined pressure ranges between about 1000 psi and about 2000 psi.

11. A method according to claim 8 further including the step of machining the cavity patterns in each of the sections.

12. A method according to claim 11 wherein the step of machining comprises routing the cavity patterns with a router tool.

13. A method according to claim 10 wherein said second predetermined pressure ranges between about 4000 psi and about 5000 psi.

14. A method according to claim 13 wherein said step of isostatically laminating the assembly includes isostatically laminating the assembly of contiguous sections at substantially 4000-5000 psi at about 72° C. for about 15 minutes.

15. A method according to claim 14 and additionally including the step of attaching a lid, a heat sink and a set of pin connectors to the substrate by brazing.

16. A method according to claim 2 and additionally including the step of firing the panel with a designated firing profile following the isostatic laminating step.

17. A method according to claim 15 wherein the pin connectors are attached by brazing metallization to a side wall surface of the substrate.

18. A method according to claim 17 and further including the step of dicing individual parts from the panel.

19. A method according to claim 17 and additionally including the step of effecting post fire printing as required.

* * * * *